(12) United States Patent
Tateishi et al.

(10) Patent No.: US 9,615,465 B2
(45) Date of Patent: Apr. 4, 2017

(54) METHOD OF PRODUCTION OF MULTILAYER CIRCUIT BOARD

(75) Inventors: Yohei Tateishi, Tokyo (JP); Takashi Iga, Tokyo (JP)

(73) Assignee: ZEON CORPORATION, Tokyo (JP)

(*) Notice: Subject to any disclaimer, the term of this patent is extended or adjusted under 35 U.S.C. 154(b) by 940 days.

(21) Appl. No.: 13/876,495

(22) PCT Filed: Sep. 30, 2011

(86) PCT No.: PCT/JP2011/072575
§ 371 (c)(1),
(2), (4) Date: Mar. 28, 2013

(87) PCT Pub. No.: WO2012/043799
PCT Pub. Date: Apr. 5, 2012

(65) Prior Publication Data
US 2013/0180767 A1    Jul. 18, 2013

(30) Foreign Application Priority Data
Sep. 30, 2010    (JP) .................................. 2010-223318

(51) Int. Cl.
*B29C 65/00* (2006.01)
*H05K 3/46* (2006.01)
*H05K 1/03* (2006.01)
*H05K 1/02* (2006.01)

(52) U.S. Cl.
CPC ............. *H05K 3/46* (2013.01); *H05K 1/0353* (2013.01); *H05K 3/4626* (2013.01); *H05K 1/0271* (2013.01); *H05K 2201/09136* (2013.01)

(58) Field of Classification Search
CPC .. H05K 1/0271; H05K 1/0353; H05K 3/4626; H05K 3/4673; H05K 2201/09136; H05K 3/46; B29C 65/4835; B29C 65/485; B29C 65/523; B05D 5/10

USPC ........................................................ 156/307.1
See application file for complete search history.

(56) References Cited

U.S. PATENT DOCUMENTS

| 2006/0257625 A1* | 11/2006 | Wakizaka | ................. B32B 7/02 |
| | | | 428/141 |
| 2009/0151984 A1* | 6/2009 | Fujimura | ................... C08J 5/24 |
| | | | 174/250 |

FOREIGN PATENT DOCUMENTS

| JP | 2001-345554 A | 12/2001 |
| JP | 2003-158373 A | 5/2003 |
| JP | 2006-28225 A | 2/2006 |
| JP | 2006-229038 A | 8/2006 |
| JP | 2006-278922 A | 10/2006 |
| JP | 2007-227567 A | 9/2007 |

OTHER PUBLICATIONS

International Search Report issued in PCT/JP2011/072575, mailed on Dec. 20, 2011.

* cited by examiner

*Primary Examiner* — John Goff
(74) *Attorney, Agent, or Firm* — Birch, Stewart, Kolasch & Birch, LLP

(57) ABSTRACT

A method of production of a multilayer circuit board comprising using a curable composition which contains a heat curable resin and curing agent (I) to form an uncured or semicured resin layer on a board (step A), then bringing a curing agent (II) able to substantially to cure the heat curable resin at a temperature at which the curing agent (I) cannot substantially cure the heat curable resin into contact with the surface of the resin layer, then heating the resin layer at a temperature at which the curing agent (I) cannot substantially cure the heat curable resin and the curing agent (II) can substantially cure the heat curable resin (step B), next heating and curing the resin layer at a temperature at which the curing agent (I) can substantially cure the heat curable resin to form an electrical insulating layer (step C).

5 Claims, No Drawings

METHOD OF PRODUCTION OF MULTILAYER CIRCUIT BOARD

TECHNICAL FIELD

The present invention relates to a method of production of a multilayer circuit board. More particularly, it relates to a method of production of a multilayer circuit board which is substantially free from warping.

BACKGROUND ART

Along with the increasingly small size and greater number of functions of electronic devices, the circuit boards which are used for electronic devices are also being required to be made higher in density. To make circuit boards higher in density, the general practice is to make the circuit boards multilayered. Such multilayer circuit boards, for example, are comprised of an inner layer board in which a conductive circuit layer is formed on the outermost surface, an electrical insulating layer laminated on its surface, and a conductive circuit layer which is further formed on the electrical insulating layer. If desired, several electrical insulating layers and conductive circuit layers may be laminated.

In such a multilayer circuit board, to extend the lifetime of the circuit board and secure the reliability, the bondability between the electrical insulating layer and the conductive circuit layer which is formed on it is important. As art for improving the bondability, for example, Patent Document 1 discloses a method of production of a multilayer circuit board on which at least an insulating resin layer and a conductor interconnect layer are formed comprising forming a foundation layer which contains a coordination polymer complex between the insulating resin layer and conductor interconnect layer. Further, Patent Document 2 discloses a method of production of a multilayer circuit board comprising forming on an inner layer board which has an outermost layer of a conductive circuit layer 1 an uncured or semicured resin layer by using a curable composition which contains an insulating polymer and a curing agent (step A), then bringing a compound which has a structure which can coordinate with a metal into contact with the surface of that resin layer (step B), next curing that shaped member to form an electrical insulating layer "b" (step C), forming a metal thin film layer on the surface of this electrical insulating layer "b" (step D), then forming a conductive circuit layer 2 including that metal thin film layer (step E).

PRIOR ART DOCUMENTS

Patent Documents

Patent Document 1: Japanese Patent Publication No. 2001-345554
Patent Document 2: Japanese Patent Publication No. 2003-158373

DISCLOSURE OF THE INVENTION

Problem to be Solved by the Invention

The inventors followed the methods described in the above patent documents to obtain multilayer circuit boards whereupon they failed to find any practical problem in the bonding of the electrical insulating layer and the conductive circuit layer. In each method, however, it became clear that when laminating an electrical insulating layer and a conductive circuit layer on one side of an inner layer board to obtain a multilayer circuit board, the board ends up warping and, for example, sometimes becomes unsuitable for mounting on a mother board. Therefore, the object of the present invention is to provide a method of production of a multilayer circuit board which is substantially free of warping.

Means for Solving the Problems

The inventors engaged in an in-depth study to solve the above problem and as a result discovered that in a multilayer circuit board obtained by forming an uncured resin layer which contains a heat curable resin and a curing agent (I) on a board, bringing a curing agent (II) which functions at a lower temperature than the curing agent (I) into contact with that surface, then heating the resin layer at a temperature at which the curing agent (II) expresses its function, then raising the temperature to complete the curing of the resin layer by the curing agent (I) and form the electrical insulating layer, substantially no warping occurs and thereby completed the present invention.

That is, according to the present invention, there are provided:

[1] A method of production of a multilayer circuit board comprising using a curable composition which contains a heat curable resin and curing agent (I) to form an uncured or semicured resin layer on a board (step A), then bringing a curing agent (II) able to substantially to cure the heat curable resin at a temperature at which the curing agent (I) cannot substantially cure the heat curable resin into contact with the surface of the resin layer, then heating the resin layer at a temperature at which the curing agent (I) cannot substantially cure the heat curable resin and the curing agent (II) can substantially cure the heat curable resin (step B), next heating and curing the resin layer at a temperature at which the curing agent (I) can substantially cure the heat curable resin to form an electrical insulating layer (step C).

[2] The method of production of the multilayer circuit board as set forth in [1] wherein, at step A, the uncured or semicured resin layer is formed by bonding a film shaped or sheet shaped article of the curable composition to the surface of the board.

[3] The method of production of the multilayer circuit board as set forth in [1] or [2], wherein at step A, the uncured or semicured resin layer is formed at only one surface of the board.

[4] The method of production of the multilayer circuit board as set forth in any one of [1] to [3], wherein, at step B, contact of the curing agent (II) with the resin layer surface is performed by dipping a board on which a resin layer is formed in an aqueous solution of the curing agent (II).

[5] The method of production of the multilayer circuit board as set forth in any one of [1] to [4], wherein the heat curable resin is at least one type of resin which is selected from the group comprised of an epoxy resin, maleimide resin, (meth)acrylic resin, diallylphthalate resin, triazine resin, alicyclic olefin polymer, aromatic polyether polymer, benzocyclobutene polymer, cyanate ester polymer, liquid crystal polymer, and polyimide.

[6] The method of production of the multilayer circuit board as set forth in any one of [1] to [5], wherein the curing agent (I) is at least one type of agent which is selected from the group comprised of a polyhydric epoxy compound, dicarboxylic acid derivative, and polyol compound.

[7] The method of production of the multilayer circuit board as set forth in any one of [1] to [6], wherein the curing agent (II) is at least one type of agent which is selected from the group comprised of a polysulfide; polymercaptan; polyamide; imidazole; and chain aliphatic polyamine, cyclic aliphatic polyamine, aliphatic-aromatic amine, aromatic amine, and complexes of these amines.

[8] A multilayer circuit board which is produced by the method of production of the multilayer circuit board as set forth in any one of [1] to [7].

Effects of the Invention

According to the present invention, it is possible to efficiently produce a multilayer circuit board with substantially no warping.

DESCRIPTION OF EMBODIMENTS

The method of production of the multilayer circuit board of the present invention has as one major characteristic using two types of curing agents which differ in temperature regions suitable for expression of their functions and heating and curing the resin layer at least at two stages of temperature to form an electrical insulating layer.

The method of production of the multilayer circuit board of the present invention has the following three steps:

(Step A) A step of using a curable composition which contains a heat curable resin and a curing agent (I) to form an uncured or semicured resin layer on a board.

(Step B) A step of bringing a curing agent (II) able to substantially to cure the heat curable resin at a temperature at which the curing agent (I) cannot substantially cure the heat curable resin into contact with the resin layer surface, then heating the resin layer at a temperature at which the curing agent (I) cannot substantially cure the heat curable resin and a temperature at which the curing agent (II) can substantially cure the heat curable resin.

(Step C) A step of heating the resin layer to cure at a temperature at which the curing agent (I) can substantially cure the heat curable resin so as to form an electrical insulating layer.

The steps will be explained in detail below:

(Step A)

The board which is used at step A is not particularly limited, but usually a board on which a conductive circuit layer "a" is formed on one or both surfaces of an electrical insulating layer "a" is used. As specific examples of the board, a printed circuit board, silicon wafer board, glass board, or other board comprised of an electrical insulating layer and conductive circuit layer formed on the surface of that may be mentioned. The thickness of the board is usually 50 μm to 2 mm, preferably 60 μm to 1.6 mm, more preferably 100 μm to 1 mm.

In a printed circuit board, the electrical insulating layer "a" which forms the board is mainly comprised of a heat curable resin which has an electrical insulating property. The heat curable resin is not particularly limited, but, for example, an alicyclic olefin polymer, epoxy resin, maleimide resin, (meth)acrylic resin, diallylphthalate resin, triazine resin, aromatic polyether polymer, cyanate ester polymer, and polyimide, etc. may be mentioned. Usually, the curable composition which contains the heat curable resin and the curing agent is cured to obtain an electrical insulating layer "a". Further, the board may contain a glass fiber, resin fiber, etc. in the electrical insulating layer "a" from the viewpoint of improvement of the strength. The material of the conductive circuit layer "a" which forms the board is usually a conductive metal.

On the above such board, a curable composition which contains a heat curable resin and a curing agent (I) is used to form an uncured or semicured resin layer.

Here, the "uncured resin layer" means a state in which substantially all of the resin layer can be dissolved in a solvent in which the heat curable resin which forms the resin layer can be dissolved. A "semicured resin layer" means a state where the resin is cured to an extent in which it can be further cured by heating and a state in which part is dissolved in a solvent in which the heat curable resin which forms the resin layer can be dissolved.

The method for forming the resin layer on the board is not especially limited, but the method of bonding a film shaped or sheet shaped article of a curable composition which contains a heat curable resin and curing agent (I) to the surface of the board, in particular so as to contact the conductive circuit layer "a" of the board, to form an uncured or semicured resin layer (step A1) and a method of coating a board with a curable composition which contains a heat curable resin and curing agent (I) and drying it to form an uncured or semicured resin layer (step A2) may be mentioned. The planar uniformity of the bonding with the conductive circuit layer which is formed as desired on the electrical insulating layer which is obtained by curing the resin layer becomes higher, so (step A1) is preferably used for forming the resin layer.

When using (step A1) for forming the resin layer, to improve the bonding between the board on which the conductive circuit layer "a" is formed and the electrical insulating layer which is formed by curing the resin layer, before bonding the film shaped or sheet shaped article of the curable composition, the surface of the board on which the conductive circuit layer "a" is formed is preferably pretreated. As the pretreatment, the method of bringing an alkaline sodium hypochlorite aqueous solution, permanganic acid, etc. into contact with the board surface to coarsen the surface, the method of using an alkaline potassium permanganate aqueous solution, potassium sulfide-ammonium chloride aqueous solution, etc. to oxidize a surface, then reduce it, the method of plating and coarsening the conductive circuit layer part of the board, the method of using a thiol compound, silane compound, etc. to form a primer layer, etc. may be mentioned. Among these as well, the method of forming a primer layer using 2-di-n-butylamino-4,6-dimercapto-s-triazine or other thiol compound is preferable since when the conductive circuit layer "a" is made of copper, there is no corrosion of copper and a high bonding is obtained.

The heat curable resin which forms the curable composition which is used for forming the resin layer is not limited so long as being one which exhibits heat curing property in combination with a curing agent and which has an electric insulating ability. For example, an epoxy resin, maleimide resin, (meth)acrylic resin, diallylphthalate resin, triazine resin, alicyclic olefin polymer, aromatic polyether polymer, benzocyclobutene polymer, cyanate ester polymer, and polyimide etc. may be mentioned. These resins may be used alone or in two or more types in combination. Among these as well, an alicyclic olefin polymer, aromatic polyether polymer, benzocyclobutene polymer, cyanate ester polymer, and polyimide is preferable, an alicyclic olefin polymer and aromatic polyether polymer are more preferable, and an alicyclic olefin polymer is particularly preferable. In addition to these polymers, a liquid crystal polymer may also be used as a preferable heat curable resin. As the liquid crystal polymer, a polymer of an aromatic or aliphatic dihydroxy compound, a polymer of an aromatic or aliphatic dicarboxylic acid, a polymer of an aromatic hydroxycarboxylic acid, a polymer of an aromatic diamine, aromatic hydroxyamine, aromatic amino carboxylic acid, etc. may be illustrated. Note that, in this description, "(meth)acrylic" means methacrylic or acrylic.

The heat curable resin is not especially limited in weight average molecular weight (Mw), but it is usually 1,000 to 1,000,000, preferably 3,000 to 500,000, more preferably 4,000 to 300,000. When forming a conductive circuit layer on an electrical insulating layer obtained by curing a resin layer and performing electroless plating, coarsening of the electrical insulating layer due to this pretreatment is suppressed, so a heat curable resin ingredient with a weight average molecular weight (Mw) of 1,000 to 1,000,000 is preferably included in a ratio, with respect to the heat curable resin which is contained in the curable composition as well, of preferably 10 wt % or more, more preferably 15 wt % or more. Note that, the upper limit of this ratio is 100 wt %, that is, the entire amount of the heat curable resin which is contained in the curable composition may be comprised of a heat curable resin ingredient with a weight average molecular weight (Mw) of 1,000 to 1,000,000. As the heat curable resin, one with a weight average molecular weight (Mw) of less than 1,000 or one with over 1,000,000 may also be contained. In this description, the weight average molecular weight (Mw) is the weight average molecular weight converted to polystyrene which is measured by gel permeation chromatography (GPC) using tetrahydrofuran as the eluent.

An alicyclic olefin polymer is a polymer of an unsaturated hydrocarbon which has an alicyclic structure. As the alicyclic structure, a cycloalkane structure, cycloalkene structure, etc. may be mentioned, but the obtained electrical insulating layer is improved in mechanical strength, heat resistance, etc., so a cycloalkane structure is preferable. Further, as the alicyclic structure, any one of a monocyclic structure and polycyclic structure (condensed polycyclic structure, bridged cyclic structure, combination polycyclic structure of the same, etc.) is possible. The number of carbon atoms which form the alicyclic structure is not particularly limited, but is usually 4 to 30, preferably 5 to 20, more preferably 5 to 15 in range. At this time, the formability of the curable composition and the mechanical strength and heat resistance of the obtained electrical insulating layer and other such properties are balanced to a high degree.

The alicyclic olefin polymer is preferably one which has a polar group. As the polar group, a hydroxyl group, carboxyl group, alkoxyl group, epoxy group, glycidyl group, oxycarbonyl group, carbonyl group, amino group, ester group, and carboxylic acid anhydride group, etc. may be mentioned. In particular, a carboxyl group and carboxylic acid anhydride group are preferable. The content of the repeating units which have polar groups in 100 mol % of the total repeating units which form the alicyclic olefin polymer is not particularly limited, but is usually 5 to 60 mol %, preferably 10 to 50 mol %. Note that, the number of polar groups which are present in the repeating units is not particularly limited, but usually is preferably 1 to 2.

An alicyclic olefin polymer is usually obtained by addition polymerization or ring opening polymerization of an alicyclic olefin monomer and, as desired, by hydrogenation of the unsaturated bond part or by addition polymerization of an aromatic olefin monomer and hydrogenation of the aromatic ring part of the obtained polymer. Further, an alicyclic olefin polymer which has polar groups is obtained by, for example, 1) introduction of polar groups to the alicyclic olefin polymer by a denaturation reaction, 2) copolymerization using a monomer having polar groups as a copolymerization ingredient, or 3) copolymerization using a monomer containing ester groups or other polar groups as a copolymerization ingredient, then hydrolysis of the ester group etc. In the case of the above 1), it is possible to adjust the amount of introduction of polar groups, while in the case of the above 2) and 3), it is possible to suitably use a monomer which does not have the desired polar groups at the time of polymerization so as to adjust the content of repeating units which have polar groups in the alicyclic olefin polymer. In this description, "alicyclic olefin monomer" means a monomer which has carbon-carbon double bonds in the alicyclic structure, while "aromatic olefin monomer" means a monomer which is comprised of aromatic groups and a chain hydrocarbon which has carbon-carbon double bonds.

As the alicyclic olefin monomer which is used for obtaining an alicyclic olefin polymer, bicyclo[2.2.1]-hept-2-ene (common name: norbornene), 5-methyl-bicyclo[2.2.1]-hept-2-ene, 5,5-dimethyl-bicyclo[2.2.1]-hept-2-ene, 5-ethyl-bicyclo[2.2.1]-hept-2-ene, 5-butyl-bicyclo[2.2.1]-hept-2-ene, 5-hexyl-bicyclo[2.2.1]-hept-2-ene, 5-octyl-bicyclo[2.2.1]-hept-2-ene, 5-octadecyl-bicyclo[2.2.1]-hept-2-ene, 5-ethylidene-bicyclo[2.2.1]-hept-2-ene, 5-methylidene-bicyclo[2.2.1]-hept-2-ene, 5-vinyl-bicyclo[2.2.1]-hept-2-ene, 5-propenyl-bicyclo[2.2.1]-hept-2-ene, 5-methoxy-carbonyl-bicyclo[2.2.1]-hept-2-ene, 5-cyano-bicyclo[2.2.1]-hept-2-ene, 5-methyl-5-methoxycarbonyl-bicyclo[2.2.1]-hept-2-ene, 5-ethoxycarbonyl-bicyclo[2.2.1]-hept-2-ene, bicyclo[2.2.1]-hept-5-enyl-2-methylpropionate, bicyclo[2.2.1]-hept-5-enyl-2-methyloctanate, bicyclo[2.2.1]-hept-2-ene-5,6-dicarboxylic acid anhydride, 5-hydroxymethylbicyclo[2.2.1]-hept-2-ene, 5,6-di(hydroxymethyl)-bicyclo[2.2.1]-hept-2-ene, 5-hydroxy-i-propylbicyclo[2.2.1]-hept-2-ene, 5,6-dicarboxy-bicyclo[2.2.1]-hept-2-ene, bicyclo[2.2.1]-hept-2-ene-5,6-dicarboxylic acid imide, 5-cyclopentyl-bicyclo[2.2.1]-hept-2-ene, 5-cyclohexyl-bicyclo[2.2.1]-hept-2-ene, 5-cyclohexenyl-bicyclo[2.2.1]-hept-2-ene, 5-phenyl-bicyclo[2.2.1]-hept-2-ene, tricyclo[4.3.0.1$^{2,5}$]deca-3,7-diene (common name: dicyclopentadiene), tricyclo[4.3.0.1$^{2,5}$]deca-3-ene, tricyclo[4.4.0.1$^{2,5}$]undeca-3,7-diene, tricyclo[4.4.0.1$^{2,5}$]undeca-3,8-diene, tricyclo[4.4.0.1$^{2,5}$]undeca-3-ene, tetracyclo[7.4.0.1$^{10,13}$.0$^{2,7}$]-trideca-2,4,6-11-tetraene (other name: 1,4-methano-1,4,4a,9a-tetrahydrofluorene), tetracyclo[8.4.0.1$^{11,14}$.0$^{3,8}$]-tetradeca-3,5,7,12,11-tetraene (other name: 1,4-methano-1,4,4a,5,10,10a-hexahydroanthracene), tetracyclo[4.4.0.1$^{2,5}$.1$^{7,10}$]-dodeca-3-ene (common name: tetracyclododecene), 8-methyl-tetracyclo[4.4.0.1$^{2,5}$.1$^{7,10}$]-dodeca-3-ene, 8-ethyl-tetracyclo[4.4.0.1$^{2,5}$.1$^{7,10}$]-dodeca-3-ene, 8-methylidene-tetracyclo[4.4.0.1$^{2,5}$.1$^{7,10}$]-dodeca-3-ene, 8-ethylidene-tetracyclo[4.4.0.1$^{2,5}$.1$^{7,10}$]-dodeca-3-ene, 8-vinyl-tetracyclo[4.4.0.1$^{2,5}$.1$^{7,10}$]-dodeca-3-ene, 8-propenyl-tetracyclo[4.4.0.1$^{2,5}$.1$^{7,10}$]-dodeca-3-ene, 8-methoxycarbonyl-tetracyclo[4.4.0.1$^{2,5}$.1$^{7,10}$]-dodeca-3-ene, 8-methyl-8-methoxycarbonyl-tetracyclo[4.4.0.1$^{2,5}$.1$^{7,10}$]-dodeca-3-ene, 8-hydroxymethyl-tetracyclo[4.4.0.1$^{2,5}$.1$^{7,10}$]-dodeca-3-ene, 8-carboxy-tetracyclo[4.4.0.1$^{2,5}$.1$^{7,10}$]-dodeca-3-ene, 8-cyclopentyl-tetracyclo[4.4.0.1$^{2,5}$.1$^{7,10}$]-dodeca-3-ene, 8-cyclohexyl-tetracyclo[4.4.0.1$^{2,5}$.1$^{7,10}$]-dodeca-3-ene, 8-cyclohexenyl-tetracyclo[4.4.0.1$^{2,5}$.1$^{7,10}$]-dodeca-3-ene, 8-phenyl-tetracyclo[4.4.0.1$^{2,5}$.1$^{7,10}$]-dodeca-3-ene, pentacyclo[6.5.1.1$^{3,6}$.0$^{2,7}$.0$^{9,13}$]pentadeca-3,10-diene, pentacyclo[7.4.0.1$^{3,6}$.1$^{10,13}$.0$^{2,7}$]-pentadeca-4,11-diene, or other such norbornene-based monomer;

cyclobutene, cyclopentene, cyclohexene, 3,4-dimethylcyclopentene, 3-methylcyclohexene, 2-(2-methylbutyl)-1-cyclohexene, cyclooctene, 3a,5,6,7a-tetrahydro-4,7-methano-1H-indene, cycloheptene, or other such monocyclic cycloalkene-based monomer; vinylcyclohexene, vinylcyclohexane, or other such vinyl-based alicyclic hydrocarbon-based monomer; cyclopentadiene, cyclohexadiene, or other such alicyclic conjugated diene-based monomer; etc. may be mentioned.

As the aromatic olefin monomer, styrene, α-methylstyrene, and divinylbenzene, etc. may be mentioned.

The alicyclic olefin monomer and/or aromatic olefin monomer may be respectively used alone or in two or more types combined.

The alicyclic olefin polymer may be obtained by copolymerization of the alicyclic olefin monomer and/or aromatic olefin monomer and monomers able to copolymerize with these monomers.

As a monomer able to copolymerize with the alicyclic olefin monomer or aromatic olefin monomer, ethylene; propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, 1-eicosene, or other $C_3$ to $C_{20}$ α-olefin; 1,4-hexadiene, 4-methyl-1,4-hexadiene, 5-methyl-1,4-hexadiene, 1,7-octadiene, or other nonconjugated diene; etc. may be mentioned. These monomers may be respectively used alone or in two or more types combined.

The polymerization of the alicyclic olefin monomer or the aromatic olefin monomer and the hydrogenation of the obtained polymer which is performed as desired are not particularly limited and may be performed by a known method.

As specific examples of an alicyclic olefin polymer, an ring-opening polymer of a norbornene-based monomer and its hydrogenate, an addition polymer of a norbornene-based monomer, an addition polymer of a norbornene-based monomer and vinyl compound, a monocyclic cycloalkene polymer, alicyclic conjugated diene polymer, vinyl-based alicyclic hydrocarbon polymer and its hydrogenate, hydrogenate obtained by hydrogenating aromatic ring of an aromatic olefin polymer, etc. may be mentioned. Among these as well, a ring-opening polymer of a norbornene-based monomer and its hydrogenate, an addition polymer of a norbornene-based monomer, an addition polymer of norbornene-based monomer and vinyl compound, and an aromatic cyclic hydrogenate of aromatic olefin polymer are preferable, in particular a hydrogenate of ring-opening polymer of norbornene-based monomer is preferable. These alicyclic olefin polymers may be used respectively alone or as two or more types combined.

Note that, among these alicyclic olefin polymers, the particularly preferable polymers of ring-opening polymers of norbornene-based monomers and their hydrogenates are classified, from their differences in structure, as polymers of a different type from polyolefin resin which are obtained by copolymerization of an olefin expressed by $C_nH_{2n}$. In this description, a "norbornene-based monomer" means an alicyclic olefin monomer which has a norbornene ring structure.

The method of adjusting the alicyclic olefin polymer in weight average molecular weight may be an ordinary method. For example, at the time of ring opening polymerization of an alicyclic olefin monomer by using a titanium-based catalyst, tungsten-based catalyst, or ruthenium-based catalyst, the method of adding a molecular weight adjuster such as a vinyl compound or diene compound in an amount of about 0.1 to 10 mol % with respect to the total amount of monomer may be mentioned. At this time, if using a smaller amount of molecular weight adjuster, a polymer with a relatively high Mw is obtained, while if using a larger amount, a polymer with a relatively low Mw is obtained.

As the vinyl compound which is used as the molecular weight adjuster, 1-butene, 1-pentene, 1-hexene, 1-octene, or other α-olefin compound; styrene, vinyltoluene, or other styrene compound; ethylvinylether, isobutylvinylether, allylglycidylether, or other ether compound; allylchloride or other halogen-containing vinyl compound; allylacetate, allylalcohol, glycidylmethacrylate, or other oxygen-containing vinyl compound; acrylamide or other nitrogen-containing vinyl compound; etc. may be mentioned. As a diene compound, 1,4-pentadiene, 1,5-hexadiene, 1,6-heptadiene, 2-methyl-1,4-pentadiene, 2,5-dimethyl-1,5-hexadiene, or other nonconjugated diene compound; 1,3-butadiene, 2-methyl-1,3-butadiene, 2,3-dimethyl-1,3-butadiene, 1,3-pentadiene, 1,3-hexadiene, or other conjugated diene compound may be mentioned.

The alicyclic olefin polymer may be suitably selected in glass transition temperature in accordance with need, but it is usually 50° C. or more, preferably 70° C. or more, more preferably 100° C. or more, most preferably 125° C. or more.

The curing agent (I) which is used in the present invention is not specially limited. For example, an ionic curing agent, radical curing agent, or a curing agent which is provided with both an ionic and radical property, etc. is used. For example, 1-allyl-3,5-diglycidylisocyanulate, 1,3-diallyl-5-glycidyl isocyanulate, and other non-halogen-containing isocyanulate-based curing agent which contains allyl groups and epoxy groups, or other nitrogen-based curing agent; bisphenol A bis(ethyleneglycol glycidylether)ether, bisphenol A bis(diethyleneglycol glycidylether)ether, bisphenol A bis(triethyleneglycol glycidylether)ether, bisphenol A bis(propyleneglycol glycidylether)ether, and other bisphenol A-based glycidylether type epoxy compound, or other glycidylether type epoxy compound, fluorene-based epoxy compound, or other alicyclic epoxy compound, glycidylester-based epoxy compound, or other polyvalent epoxy compound; acid anhydride or dicarboxylic acid compound or other dicarboxylic acid derivative; diol compound, triol compound, polyvalent phenol compound, or other polyol compound; or other curing agent may be mentioned. These curing agents (I) may be suitably respectively used alone or as two or more types combined. Among these as well, from the viewpoint of raising the obtained electrical insulating layer in mechanical strength, as the curing agent (I), using at least one type of agent selected from the group comprised of a polyvalent epoxy compound, dicarboxylic acid derivative, and polyol compound is preferable, while using a polyvalent epoxy compound is more preferable.

The curing of the curable composition proceeds by heating the composition, but the temperature region at which the above curing agent (I) can substantially cure the heat curable resin is usually 150 to 300° C. in range.

The amount of the curing agent (I) blended into the curable composition which is used in the present invention is, with respect to 100 parts by weight of the heat curable resin, usually 1 to 500 parts by weight.

To make the curing reaction between the alicyclic olefin polymer and the curing agent (I) proceed, a curing accelerator etc. may be used. When the curing agent (I) is, for example, a polyvalent epoxy compound, a curing accelerator constituted by a tertiary amine-based compound, a boron trifluoride complex compound, etc. is suitable. Among these as well, if using tertiary amine-based compounds, the lamination ability of the obtained electrical insulating layer with micro interconnects, insulation resistance, heat resistance, and chemical resistance are improved.

As specific examples of the tertiary amine-based compound, benzyldimethylamine, triethanolamine, triethylamine, tributylamine, tribenzylamine, dimethylformamide, or other chain tertiary amine compound; pyrrazoles, pyridines, pyrazines, pyrimidines, indazoles, quinolines, isoquinolines, imidazoles, triazoles, etc. may be mentioned. Among these as well, imidazoles, in particular substituted imidazole compounds which have substituents, are preferable.

As specific examples of the substituted imidazole compound, 2-ethylimidazole, 2-ethyl-4-methylimidazole, bis-2-ethyl-4-methylimidazole, 1-methyl-2-ethylimidazole, 2-isopropylimidazole, 2,4-dimethylimidazole, 2-heptadecylimidazole, or other alkyl substituted imidazole compound; 2-phenylimidazole, 2-phenyl-4-methylimidazole, 1-benzyl-2-methylimidazole, 1-benzyl-2-ethylimidazole, 1-benzyl-2-phenylimidazole, benzimidazole, 2-ethyl-4-methyl-1-(2'-cyanoethyl)imidazole, 2-ethyl-4-methyl-1-[2'-(3'',5'''-diaminotriazinyl)ethyl]imidazole, 1-(2-aminoethyl)-2-methyl-1H-imidazole, or other imidazole compound which is substituted by a hydrocarbon group containing a ring structure such as an aryl group, arakyl group, etc. may be mentioned. Among these as well, due to the excellent compatibility with an alicyclic olefin polymer, an imidazole compound which is substituted by a hydrocarbon group containing a ring structure is preferable, while 1-benzyl-2-phenylimidazole is particularly preferable.

The curing accelerator is used alone or in two or more types combined. The amount of the curing accelerator is suitably selected in accordance with the objective of use, but is, with respect to 100 parts by weight of heat curable resin, usually 0.001 to 30 parts by weight, preferably 0.01 to 10 parts by weight, more preferably 0.03 to 5 parts by weight.

The curable composition which is used for the present invention may have other ingredients blended into it as desired. For example, a compound which has absorption in the wavelength region of a laser beam which is used when forming via holes, through holes, or other holes is preferable. When using a $CO_2$ gas laser, silica etc. is used, while when using a UV laser (for example, a UV-YAG laser etc.), a UV absorbant is used. When using a curable composition which contains a compound which has absorption in the wavelength region of a laser beam, a laser can be used to easily form holes in the obtained electrical insulating layer and formation of smears etc. is reduced.

As specific examples of the UV absorbant, phenylsalicylate, p-tert-butylphenylsalicylate, p-octylphenylsalicylate, or other salicylic acid-based compound; 2,4-dihydroxybenzophenone, 2-hydroxy-4-methoxybenzophenone, 2-hydroxy-4-octoxy-benzophenone, 2-hydroxy-4-dodecyloxy-benzophenone, 2,2'-dihydroxy-4-methoxybenzophenone, 2,2'-dihydroxy-4,4'-dimethoxybenzophenone, 2-hydroxy-4-methoxy-5-sulfobenzophenone, bis(2-hydroxy-4-methoxybenzoylphenyl)methane, or other benzophenone-based compound;

2-(2'-hydroxy-5'-methylphenyl)benzotriazole, 2-(2'-hydroxy-5'-tert-butylphenyl)benzotriazole, 2-(2'-hydroxy-3',5'-di-tert-butylphenyl)-5-chlorobenzotriazole, 2-(2'-hydroxy-3',5'-di-tert-amylphenyl)benzotriazole, 2-[2'-hydroxy-3'-(3'',4'',5'',6''-tetrahydrophthalimidemethyl)-5'-methylphenyl]benzotriazole, 2,2-methylenebis[4-(1,1,3,3-tetramethylbutyl)-6-(2H-benzotriazol-2-yl)phenol], 2-[2-hydroxy-3,5-bis(α,α-dimethylbenzyl)phenyl]benzotriazole, or other benzotriazole-based compound; 2,4-di-tert-butyl-phenyl-3',5'-di-tert-butyl-4'-hydroxybenzoate, or other benzoate-based compound; 2-ethylhexyl-2-cyano-3,3'-diphenylacrylate, ethyl-2-cyano-3,3'-diphenylacrylate, or other cyanoacrylate-based compound; bis (2,2,6,6-tetramethyl-piperidinyl-4)sebacate, or other hindered amine-based compound; nickel bis(octylphenyl)sulfide, [2,2'-thiobis(4-tert-octylphenolate)]-n-butylaminenickel, or other organometallic compound, etc. may be mentioned. Among these as well, due to the excellent compatibility with an alicyclic olefin polymer and stability at the time of heat curing, a benzotriazole-based compound is preferable.

The amount of the UV absorbant is, with respect to 100 parts by weight of the heat curable resin, normally 0.1 to 30 parts by weight, preferably 1 to 10 parts by weight.

In addition, a flame retardant, soft polymer, heat resistance stabilizer, weather resistance stabilizer, antiaging agent, leveling agent, antistatic agent, slip agent, antiblocking agent, anti-fogging agent, lubricant, dye, pigment, natural oil, synthetic oil, wax, emulsifier, filler, etc. may be used as another ingredient. The amounts of these are suitably selected within a range not impairing the object of the present invention.

The film shaped or sheet shaped article of a curable composition which is used at (step A1) is usually obtained by shaping a curable composition by the solution casting process, melt casting process, etc., but use of the solution casting process for production is preferable. When using the solution casting process for shaping, a varnish is coated on the support, then the organic solvent is dried off.

As the support which is used for solution casting, a resin film (carrier film), metal foil, etc. may be mentioned. As the resin film, normally a thermoplastic resin film is used. Specifically, a polyethylene terephthalate film, polypropylene film, polyethylene film, polycarbonate film, polyethylene naphthalate film, polyarylate film, nylon film, etc. may be mentioned. In these resin films, due to the excellent heat resistance, chemical resistance, release property after lamination, etc., a polyethylene terephthalate film and polyethylene naphthalate film are preferable. As the metal foil, for example, copper foil, aluminum foil, nickel foil, chrome foil, gold foil, silver foil, etc. may be mentioned. Since the conductivity is good and the price is low, copper foil, in particular, electrolytic copper foil or rolled copper foil is suitable. The thickness of the support is not particularly limited, but from the viewpoint of the workability etc., usually is 1 to 150 μm, preferably 2 to 100 μm, more preferably 3 to 50 μm.

The method of obtaining the varnish is not specially limited. For example, it is obtained by mixing the ingredients which form the curable composition and an organic solvent. The ingredients may be mixed in accordance with an ordinary method. For example, this may be performed by stirring by a roater and magnetic stirrer or using a high speed homogenizer, dispersion mixer, planetary stirrer, twin-screw kneader, ball mill, triple roll, etc. The temperature at the time of mixing is in a range where the reaction due to the curing agent (I) affects the workability. Further, from the viewpoint of safety, less than the boiling point of the organic solvent which is used at the time of mixing is preferable.

As the organic solvent, for example, toluene, xylene, ethylbenzene, trimethylbenzene, anisole, or other aromatic hydrocarbon-based organic solvent; n-pentane, n-hexane, n-heptane, or other aliphatic hydrocarbon-based organic solvent; cyclopentane, cyclohexane, or other alicyclic hydrocarbon-based organic solvent; chlorobenzene, dicyclobenzene trichlorobenzene, or other halogenated hydrocarbon-based organic solvent; methylethylketone, methylisobutylketone, cyclopentanone, cyclohexanone, or other ketone-based organic solvent, etc. may be mentioned. These organic solvents may be used alone or in two or more types combined.

The amount of organic solvent used is suitably selected for control of the thickness of the obtained shaped article or improvement of flatness or other objective, but the solid content concentration of the varnish is usually 5 to 85 wt %, preferably 10 to 80 wt %, more preferably 20 to 70 wt %.

As the coating method, dip coating, roll coating, curtain coating, die coating, slit coating, or other method may be mentioned. Further, the conditions for removal and drying of the organic solvent are suitably selected according to the type of the organic solvent. The drying temperature is usually 20 to 300° C., preferably 30 to 200° C., while the drying time is usually 30 seconds to 1 hour, preferably 1 minute to 30 minutes.

Note that, when producing the film shaped or sheet shaped article of the curable composition, for example, it is possible to coat and impregnate a varnish on a fiber substrate on a support and suitably remove the organic solvent so as to obtain a film shaped or sheet shaped composite article comprised of a curable composition impregnated in a fiber substrate. As the fiber substrate, polyamide fiber, polyaramide fiber, polyester fiber, or other organic fiber and glass fiber, carbon fiber, or other inorganic fiber may be mentioned. Further, as the form of the fiber substrate, a flat weave, twill weave, or other form of woven fabric, form of nonwoven fabric, etc. may be mentioned. As the thickness of the fiber substrate, from the viewpoint of the ease of handling of the obtained shaped article or embedding of interconnects, 5 to 100 μm is preferable and 10 to 50 μm in range is more preferable.

The film shaped or sheet shaped article has a thickness of usually 0.1 to 150 μm, preferably 0.5 to 100 μm, more preferably 1 to 80 μm. The film shaped or sheet shaped article may be a single-layer structure or a multilayer structure. The layers may be the same type or may be different types. Note that, when desiring to obtain a film or sheet alone, a film or sheet is formed on a support, then is peeled off from the support.

At (step A1), the film shaped or sheet shaped article of the curable composition is bonded on the board usually by superposing a film shaped or sheet shaped article with a support on the board so that the shaped article contacts the conductive circuit layer "a" then using a pressure laminator, press, vacuum laminator, vacuum press, roll laminator, or other pressing machine to hot press (laminate) them and bond the two so that substantially no space is present at the interface of the board surface and the shaped article. The hot pressing is preferably performed under reduced pressure so as to improve the embedding of interconnects in the shaped article and suppress the formation of bubbles. The temperature at the time of hot pressing is usually 30 to 250° C., preferably 70 to 200° C., the pressing force is usually 10 kPa to 20 MPa, preferably 100 kPa to 10 MPa, the pressing time is usually 30 seconds to 5 hours, preferably 1 minute to 3 hours, and the atmosphere is reduced in pressure to usually 100 kPa to 1 Pa, preferably 40 kPa to 10 Pa.

The shaped articles which are bonded to the board may be two or more articles. For example, to improve the flatness of the electrical insulating layer or to increase the thickness of the electrical insulating layer, it is also possible to bond another shaped article to the board to which the shaped article is bonded so as to contact that shaped article. The shaped articles which are used may be of the same type or may be of mutually different types. When bonding a plurality of shaped articles to a board to laminate the shaped articles, what contacts the curing agent (II) at the next (step B) becomes the surface of the shaped article which is finally laminated.

When using (step A2) to form the resin layer, it is sufficient to directly coat and dry a varnish of the above-mentioned curable composition on the board. The methods and conditions etc. of coating and drying may be similar to those when forming the film shaped or sheet shaped articles of a curable composition.

On the board, the resin layer may be formed on both sides of the board or may be formed on only one side. In the past, in particular, warping occurred remarkably in a multilayer circuit board which is formed by laminating an electrical insulating layer and a conductive circuit layer on only one side of the board, so the method of production of the multilayer circuit board of the present invention is extremely suitable for forming the resin layer at only one side of the board to produce a multilayer circuit board.

(Step B)

At step B, a curing agent (II) which can substantially cure a heat curable resin at a temperature at which the curing agent (I) substantially cannot cure a heat curable resin is brought into contact with the surface of the resin layer which is formed on the board at step A, then the resin layer after being brought into contact with the curing agent (II) is heated at a temperature at which the curing agent (I) substantially cannot cure the heat curable resin and the curing agent (II) substantially can cure the heat curable resin.

In this description, for a predetermined curing agent, "it substantially cannot cure a heat curable resin" means that when heating a heat curable resin in the presence of the curing agent at a predetermined temperature for 1 hour, the reduction in weight due to the amount of dissolution after heating of the heat curable resin in a solvent to which the uncured heat curable resin exhibits solubility compared with the amount of dissolution before heating in that solvent (amount of reduction of amount of dissolution corresponding to cured (cross-linked) insoluble part) is within 5 wt %. Further, for a predetermined curing agent, "the temperature at which it substantially cannot cure a heat curable resin" means a temperature of usage of the curing agent which substantially cannot cure a heat curable resin. On the other hand, for a predetermined curing agent, "it substantially can cure a heat curable resin" means that when heating a heat curable resin in the presence of the curing agent at a predetermined temperature for 1 hour, the reduction in weight due to the amount of dissolution after heating of the heat curable resin in a solvent to which the uncured heat curable resin exhibits solubility compared with the amount of dissolution before heating in that solvent is 95 wt % or more. Further, for a predetermined curing agent, "the temperature at which it substantially can cure a heat curable resin" means a temperature of usage of the curing agent which substantially can cure a heat curable resin.

In the method of production of the multilayer circuit board of the present invention, two types of curing agents which differ in temperature region able to substantially cure a heat curable resin, that is, a curing agent (I) and curing agent (II), are used. In the case of comparing the two curing agents, the above temperature region of the curing agent (I) is at the high temperature side, while the above temperature region of the curing agent (II) is at the low temperature side. At step B, the resin layer brought into contact with the curing agent (II) is heated, but under the heating conditions at this time, usually the heat curable resin does not substantially exhibit fluidity, but maintains the obtained shape as a resin layer which partially cures at the part in contact with the curing agent (II) (preliminary curing), then, at step C, the resin layer is further heated and is made to substantially completely cure due to the curing agent (I) (main curing) to form the electrical insulating layer. In this case, because the resin layer maintains its shape by the preliminary curing at step B, for example, even if a temperature difference occurs at the time of the main curing (high temperature) and the time of storage of the multilayer circuit board (room temperature), the obtained electrical insulating layer is small in deformation. As a result, in the multilayer circuit board of the present invention, it is believed that warping does not occur.

At step B, a curing agent (II) is brought into contact with the surface of the resin layer which was formed on the board at step A. When bonding a film shaped or sheet shaped article of a curable composition on the board to form a resin layer, if using a shaped article with a support, this support is peeled off, then the curing agent (II) is brought into contact with the surface of the resin layer.

The curing agent (II) which is used in the present invention is not particularly limited, but from the viewpoint of effectively performing preliminary curing, at last one agent selected from the group comprised of a polysulfide; polymercaptan; polyamide; imidazole; and a chain aliphatic polyamine, cyclic aliphatic polyamine, aliphatic-aromatic amine, aromatic amine, and complexes of these amines is preferably used, while a chain aliphatic polyamine is more preferably used. As the chain aliphatic polyamine, for example, diethylenetriamine, triethylenetetramine, tetraethylenepentamine, diproprenediamine, diethylaminopropylamine, hexamethylenediamine, etc. may be mentioned. As the cyclic aliphatic polyamine, for example, N-aminoethylpiperadine etc. may be mentioned. As the aliphatic-aromatic amine, for example, xylenediamine, a xylenediamine trimer (for example, "Amine Black" or "Sho-Amine Black" made by Showa Denko), xylenediamine derivative (for example, "Sho-Amine N", "Sho-Amine 1001", and "Sho-Amine 1010" made by Showa Denko), etc. may be mentioned. As the aromatic amine, for example, metaphenylenediamine, diaminodiphenylmethane, etc. may be mentioned. These may be respectively used alone or as two or more types combined. The temperature region at which the curing agent (II) substantially can cure the heat curable resin is usually 20° C. or more and less than 150° C. in range.

The method of bringing the curing agent (II) into contact with the resin layer surface is not particularly limited. For example, the dip method of dissolving the curing agent (II) in water or an organic solvent to form a solution, then dipping the board on which the resin layer is formed in the obtained solution, the spray method of coating that solution on the surface of the resin layer on the board by spraying etc., may be mentioned. To make the curing agent (II) contact the resin layer surface, from the viewpoint of effectively performing preliminary curing, it is preferable to dip the board on which the resin layer is formed into an aqueous solution of the curing agent (II). Further, it is preferable to perform this operation substantially for the resin layer surface as a whole. The contact operation may be performed once or two or more times repeatedly.

The temperature at the time of contact may be freely selected considering the temperature region at which the curing agent (II) substantially can cure the heat curable resin, the boiling point of the solvent of the solution, etc., but is usually 10 to 100° C., preferably 15 to 65° C. in range. When performing the contact by the dip method, the dipping time may be suitably selected in accordance with the concentration etc. of the curing agent (II) solution, but is usually 0.1 to 360 minutes, preferably 0.1 to 60 minutes.

After the operation for bringing the curing agent (II) into contact with the resin layer surface, it is also possible to adopt the method of spraying nitrogen or other inert gas in order to remove the excess of the curing agent (II). Further, before this operation for removal, water or organic solvent may be used to wash the board surface.

The solvent which can be used for preparation of the solution of the curing agent (II) is not limited so long as the resin layer is not easily dissolved and the curing agent (II) is dissolved in it. For example, water; diethylether or other ether; ethanol, isopropanol, or other alcohol; acetone or other ketone; ethyl cellosolve acetate or other cellosolve; or other polar solvent and their mixtures may be mentioned. The solution of the curing agent (II) is not particularly limited in the concentration of the curing agent (II), but from the viewpoint of effectively performing the preliminary curing, it is usually 0.001 to 70 wt %, preferably 0.01 to 50 wt %. By dipping the board on which the resin layer is formed into the solution of the curing agent (II) or by spraying that solution on the surface of the resin layer on the board, the preliminary curing can be performed well.

Note that, when, at the usage temperature, the curing agent (II) is liquid and there is nothing obstructing the contact operation of the curing agent (II) on the surface of the resin layer, the contact operation can also be performed with the curing agent (II) as is without particularly dissolving it in a solvent.

It is possible to blend in any surfactant etc. as an ingredient other than the curing agent (II) into the solution of the curing agent (II) from the viewpoint of improving the wettability of the curing agent (II) and the resin layer surface. The amount of the ingredients other than the curing agent (II) is usually 10 wt % or less, preferably 5 wt % or less, more preferably 1 wt % or less.

The curing agent (II) is made to contact the surface of the resin layer, then the resin layer is heated. The heating is performed at a temperature at which the curing agent (I) substantially cannot cure the heat curable resin and the curing agent (II) can substantially cure the heat curable resin, but the heating temperature is usually 20° C. or more and less than 150° C. Further, the heating time is usually 0.1 to 5 hours, preferably 0.5 to 3 hours. The resin layer may be heated (i) by maintaining a constant temperature for a certain time, (ii) by performing the heating of the (i) in a certain temperature region in a combination of multiple stages, (iii) by raising the temperature from the lower limit to the upper limit of a certain temperature region steadily or irregularly over a certain time, or (iv) by suitably combining the (i) to (iii). Among these, from the viewpoint of effectively performing preliminary curing, the resin layer is preferably heated by the above (iv). The heating method is not particularly limited. For example, an oven etc. may be used.

(Step C)

After the above (step B), the preliminarily cured resin layer is heated and cured at the temperature at which the curing agent (I) can substantially cure the heat curable resin so as to form the electrical insulating layer.

The resin layer is usually cured by heating the resin layer (board as a whole on which resin layer is formed). The curing conditions may be suitably selected in accordance with the curing agent (I), but the heating temperature of the resin layer is usually 150 to 300° C. and the heating time is usually 0.1 to 5 hours, preferably 0.5 to 3 hours. The resin layer is heated as in the above (i) to (iv) in the same way as the heating of the resin layer after making the curing agent (II) contact its surface at step B, but from the viewpoint of effectively performing the main curing, heating by the above (i) is preferable. The heating method is not particularly limited. For example, it may be performed using an oven etc. By the heating of the resin layer at step C, the resin layer is substantially completely cured and an electrical insulating layer is formed. The electrical insulating layer is not particularly limited in thickness, but is usually 1 to 50 μm.

In the above way, the multilayer circuit board of the present invention is produced. In this multilayer circuit board, substantially no warping occurs. Here, "substantially" means an extent not posing a problem in practical use. Note that, in the multilayer circuit board of the present invention, the electrical insulating layer which is formed on the conductive circuit layer "a" of the board may be further provided with a conductive circuit layer "b". In this case, it forms openings for forming via holes in the electrical insulating layer in order to connect the conductive circuit layer "a" and the conductive circuit layer "b" before forming the conductive circuit layer "b". From the viewpoint of being able to form finer via holes without causing a drop in the characteristics of the electrical insulating layer, a method using a $CO_2$ gas laser, excimer laser, UV-YAG laser, or other laser is preferable.

In the method of production of the multilayer circuit board of the present invention, as the method of forming the conductive circuit layer "b" on the electrical insulating layer which is formed on the board (below, sometimes referred to as the "electrical insulating layer 'b'"), the method of forming the electrical insulating layer "b", then forming the metal thin film layer on it and, furthermore, using electroplating or other wet plating to grow the plating and form the conductive circuit layer may be mentioned. The openings for formation of via holes in the electrical insulating layer "b" are usually formed before forming the metal thin film layer. The metal thin film layer may be formed by the electroless plating method, sputtering method, vacuum deposition method, etc. In particular, the electroless plating method or sputtering method is preferably used. The metal thin film layer is formed on the surface of the electrical insulating layer "b" and on the inner wall surface of the opening for formation of the via hole use. After forming the metal thin film layer and before growing the plating, a plating resist is formed on the metal thin film layer, the plating is grown, then the plating resist is removed and, furthermore, etching is used to etch the metal thin film layer and form the conductive circuit layer "b". This conductive circuit layer "b" is usually comprised of a metal thin film layer and plating grown on top of it.

By using the thus obtained multilayer circuit board as the board and repeating the formation of the electrical insulating layer by steps A to C in the present invention and the formation of the conductive circuit layer on the electrical insulating layer, further multilayering can be formed.

According to the present invention, even if forming a multilayer circuit on one side of the board, it is possible to obtain a multilayer circuit board which is substantially free of warping. For this reason, as the method of forming the multilayer circuit on the silicon wafer board in the "wafer level package (WLP)" art of directly forming the multilayer circuit on the silicon wafer board before dicing into individual chips so as to keep the areas of the packages equal to the chips, the method of production of the multilayer circuit board of the present invention is particularly suitable.

The multilayer circuit board of the present invention can be used as a printed circuit board for mounting a CPU, memory, other semiconductor device, or other mounted part in a computer, mobile phone, or other electronic device. In particular, a board which has microinterconnects is suitable as a high density printed circuit board in a high speed computer or a mobile computer used at the high frequency region.

EXAMPLES

Below, examples and comparative examples will be given to explain the present invention in more detail. Note that, in the examples, parts and are based on weight unless otherwise specially indicated. Various types of physical properties were evaluated by the following method.

(1) Amount of Monomer in Polymerization Solution: A polymerization solution was diluted by tetrahydrofuran and measured by gas chromatography (GC) to find the amount of monomer in the polymerization solution.

(2) Number Average Molecular Weight (Mn) and Weight Average Molecular Weight (Mw) of Polymer: Tetrahydrofuran was used as a developing solvent and gel permeation chromatography (GPC) was used for measurement to find the molecular weights as values converted to polystyrene.

(3) Hydrogenation Rate of Polymer: The hydrogenation rate means the ratio of the number of moles of unsaturated bonds which are hydrogenated to the number of moles of unsaturated bonds in the polymer before hydrogenation and was found by 400 MHz 1H-NMR spectroscopy.

(4) Content of Repeating Units Which Have Carboxylic Acid Anhydride Groups of Polymer: It means ratio of number of moles of repeating units which have carboxylic acid anhydride groups with respect to number of moles of total monomer units in polymer and was found by 400 MHz 1H-NMR spectroscopy.

(5) Viscosity of Varnish: E-type viscometer used to measure dynamic viscosity at 25° C.

(6) Amount of Warping of Board: A multilayer board comprised of a board on one surface of which an insulating layer is formed is placed on a flat surface with its projecting surface downward, and the distance from the flat surface to the end of the multilayer board which rises due to warping the most is measured as the amount of warping of the board.

Synthesis Example 1 of Heat Curable Resin

As a first stage of polymerization, 5-ethylidene-bicyclo[2.2.1]hept-2-ene (below, abbreviated as "EdNB") 35 molar parts, 1-hexene 0.9 molar part, anisole 340 molar parts and a ruthenium-based polymerization catalyst constituted by 4-acetoxybenzylidene(dichloro)(4,5-dibromo-1,3-dimesityl-4-imidazolin-2-ylidene)(tricyclohexylphosphine)ruthenium (C1063, made by Wako Pure Chemical Industries) 0.005 part were charged into a pressure resistant glass reactor with an inside substituted with nitrogen. A polymerization reaction was performed under stirring at 80° C. for 30 minutes to obtain a solution of an ring-opening polymer of a norbornene-based monomer (below, referred to as a norbornene-based ring-opening polymer).

Next, as a second stage of polymerization, to the solution which was obtained at the first stage of polymerization, tetracyclo[9.2.1.0$^{2,10}$.0$^{3,8}$]tetradeca-3,5,7,12-tetraene (methanotetrahydrofluorene, below abbreviated as "MTF") 35 molar parts, bicyclo[2.2.1]hept-2-ene-5,6-dicarboxylic acid anhydride (below abbreviated as "NDCA") 30 molar parts, anisole 250 molar parts, and C1063: 0.01 part were added. A polymerization reaction was performed under stirring at 80° C. for 1.5 hours to obtain a solution of a norbornene-based ring-opening polymer. This solution was measured by gas chromatography, whereupon it was confirmed that substantially no monomer remained. The polymerization conversion rate was 99% or more.

Next, an autoclave with an inside substituted with nitrogen and equipped with a stirrer was charged with a solution of the obtained ring-opening polymer, C1063: 0.03 part was added, then the mixture was stirred at 150° C. at a hydrogen pressure of 7 MPa for 5 hours for a hydrogenation reaction to obtain a solution of a polymer (A-1) of a hydrogenate of a norbornene-based ring-opening polymer. The obtained polymer (A-1) had a weight average molecular weight of 60,000, number average molecular weight of 30,000, and molecular weight distribution of 2. Further, the hydrogenation rate was 95%, and the content of the repeating units which have carboxylic acid anhydride groups was 30 mol %. The solution of the polymer (A-1) had a solid content concentration of 22%.

Synthesis Example 2 of Heat Curable Resin

MTF 70 molar parts, NDCA 30 molar parts, 1-hexene 0.9 molar part, anisole 590 molar parts, and C1063: 0.015 molar part were charged into a pressure resistant glass reactor with an inside substituted with nitrogen. A polymerization reaction was performed under stirring at 80° C. for 1 hour to obtain a solution of a norbornene-based ring-opening polymer. This solution was measured by gas chromatography, whereupon it was confirmed that substantially no monomer remained. The polymerization conversion rate was 99% or more.

Next, an autoclave with an inside substituted with nitrogen and equipped with a stirrer was charged with a solution of the obtained ring-opening polymer, then the mixture was stirred at 150° C. at a hydrogen pressure of 7 MPa for 5 hours for a hydrogenation reaction to obtain a solution of a polymer (A-2) of a hydrogenate of a norbornene-based ring-opening polymer. The obtained polymer (A-2) had a weight average molecular weight of 50,000, number average molecular weight of 26,000, and molecular weight distribution of 1.9. Further, the hydrogenation rate was 97%, while the content of the repeating units which have carboxylic acid anhydride groups was 30 mol %. The solution of the polymer (A-2) had a solid content concentration of 22%.

Synthesis Example 3 of Heat Curable Resin

MTF 70 molar parts, NDCA 30 molar parts, 1-hexene 6 molar parts, anisole 590 molar parts, and C1063: 0.015 molar part were charged into a pressure resistant glass reactor with an inside substituted with nitrogen. A polymerization reaction was performed under stirring at 80° C. for 1 hour to obtain a solution of a norbornene-based ring-opening polymer. This solution was measured by gas chromatography, whereupon it was confirmed that substantially no monomer remained. The polymerization conversion rate was 99% or more.

Next, an autoclave with an inside substituted with nitrogen and equipped with a stirrer was charged with a solution of the obtained ring-opening polymer, then the mixture was stirred at 150° C. at a hydrogen pressure of 7 MPa for 5 hours for a hydrogenation reaction. Next, the obtained hydrogenation reaction solution was concentrated to obtain a solution of the hydrogenate of the norbornene-based ring-opening polymer constituted by the polymer (A-3). The obtained polymer (A-3) had a weight average molecular weight of 10,000, a number average molecular weight of 5,000, and a molecular weight distribution of 2. Further, the hydrogenation rate was 97%, while the content of the repeating units which have carboxylic acid anhydrides was 30 mol %. The solution of the polymer (A-3) had a solid content concentration of 55%.

Production Example 1

Curable Composition B-1

A solution of the polymer (A-1) 450 parts and a silica slurry 150 parts, obtained by dispersing spherical silica (Admafine (registered trademark) SO-C1, made by Admatechs, volume average particle size 0.25 μm) 40% and the polymer (A-2) 2% in anisole, were mixed and stirred by a planetary stirrer for 3 minutes.

To this, a solution of a curing agent (I) constituted by a polyfunctional epoxy resin (1032H60, made by Mitsubishi Chemical, epoxy equivalent 163 to 175) dissolved in anisole to 70%: 4.5 parts, a lasering enhancer constituted by 2-[2-hydroxy-3,5-bis(α,α-dimethylbenzyl)phenyl]-2H-benzotriazole 1 part, an antiaging agent constituted by tris(3,5-di-t-butyl-4-hydroxybenzyl)-isocyanulate 1 part, an elastomer constituted by a solution of liquid epoxylated polybutadiene (Ricon (registered trademark) 657, made by Sartomer Japan) dissolved in anisole to 80%: 3 parts, and anisole 370 parts were mixed and stirred by a planetary stirrer for 3 minutes.

Furthermore, to this, a curing accelerator constituted by a solution of 1-(2-aminoethyl)-2-methyl-1H-imidazole dissolved in anisole to 1%: 70 parts was mixed and stirred by a planetary stirrer for 5 minutes to obtain a varnish of a curable composition (B-1). The varnish had a viscosity of 230 mPa·sec.

Production Example 2

Curable Composition B-2

A solution of the polymer (A-2) 44 parts, a solution of the polymer (A-3) 32 parts, and a silica slurry 863 parts, obtained by mixing a surface treated spherical silica (Admafine SC-2500-SXJ, made by Admatechs, treated by amino silane type silane coupling agent) 78% and the polymer (A-3) 2% with anisole, treating this by a high pressure homogenizer for 15 minutes, then dispersing it, were mixed and stirred by a planetary stirrer for 3 minutes.

To this, a curing agent (I) constituted by a fluorene-based epoxy resin (Ogsol (registered trademark) PG-100, made by Osaka Gas Chemicals, epoxy equivalents 163 to 175) 123 parts, a bisphenol A type epoxy resin (Epicoat (registered trademark) 828EL, made by Mitsubishi Chemical, epoxy equivalents 184 to 194) 28 parts, a polyfunctional epoxy resin 1032H60: 23 parts, an antiaging agent constituted by tris(3,5-di-t-butyl-4-hydroxybenzyl)-isocyanulate 1 part, a dicyclopentadiene type novolac resin (GDP-6095LR, made by Gunei Chemical Industry) 81 parts, and a solution of CP-002 (mixture of fluorene-based phenol monomer and bisphenol A, made by Osaka Gas Chemicals) dissolved in anisole to 50%: 60 parts were mixed and stirred by a planetary stirrer for 3 minutes. Furthermore, to this, a curing accelerator constituted by a solution of 1-benzyl-2-phenylimidazole dissolved in anisole to 5%: 25 parts was mixed. The mixture was stirred by a planetary stirrer for 5 minutes to obtain a varnish of a curable composition (B-2). The varnish had a viscosity of 2300 mPasec.

Example 1

A varnish of the curable composition (B-1) was coated on a thickness 100 μm polyethylene terephthalate film (support) using a wire bar, next, this was dried in a nitrogen atmosphere at 130° C. for 90 seconds to obtain a supported film (C-1) formed with a resin layer of a thickness of the uncured curable composition (B-1) of 3 μm.

Next, the surface of the curable composition (B-1) of the supported film (C-1) was coated with a varnish of the curable composition (B-2) using a doctor blade (made by Tester Sangyo) and auto film applicator (made by Tester Sangyo), next, this was dried under a nitrogen atmosphere at 80° C. for 10 minutes to obtain a supported film (C-2) formed with a resin layer of a total thickness of the curable composition of 13 μm. The supported film (C-2) was formed in the order of the support, the resin layer of the curable composition (B-1), and the resin layer of the curable composition (B-2).

On one surface of a board constituted by a diameter 4 inch circular glass board (D263, made by Schott, thickness 150 μm), the above obtained supported film (C-2) was superposed so that the surface of the resin layer of the curable composition (B-2) overlaid the board. This assembly was reduced in pressure using a vacuum laminator provided with heat resistant rubber press plates at the top and bottom (made by Meiki Co., ltd) at a vacuum degree of 13 hPa or less for 30 seconds, then hot pressed by the heat resistant rubber press plates at a pressing temperature of 110° C. and a pressing pressure of 0.1 MPa for 60 seconds (primary pressing). Furthermore, a hydraulic press device provided with metal press plates at the top and bottom was used to hot press the assembly at a pressing temperature 110° C. by 1 MPa for 90 seconds (secondary pressing). Next, the support was peeled off to obtain a laminate of a resin layer of a curable composition and a board.

This laminate was dipped in a curing agent (II) constituted by triethylenetetramine (hereinafter, abbreviated as "TETA") in a 5% aqueous solution at 25° C. for 1 hour, then the excess solution was removed by an air gun. Next, the laminate was placed with the board side down on an oven plate and was raised in temperature and heated in an oven (INH-9C2, made by Koyo Lindberg) from 60 to 120° C. over 1 hour. Next, this was heated at 120° C. for 30 minutes, then raised in temperature and heated from 120 to 180° C. for 1 hour. Furthermore, this was heated at 180° C. for 30 minutes and the resin layer of the curable composition was cured to obtain a multilayer board on which an insulating layer was formed. The obtained laminated board was measured for the amount of warping, whereupon the amount of warping was 1.5 mm. The results are shown in Table 1.

Comparative Example 1

Except for using ion exchanged water instead of TETA 5% aqueous solution, the same method was followed as in Example 1 to obtain a laminated board formed with an insulating layer. Note that, the total thickness of the resin layer was 14 μm. The obtained laminated board was measured for the amount of warping, whereupon the amount of warping was 2.5 mm. The results are shown in Table 1.

Comparative Example 2

Except for dipping the laminate of the resin layer of the curable composition and board in a TETA 5% aqueous solution, then heating by an oven at 180° C. for 60 minutes to cause the resin layer to completely cure without multiple stages of heat treatment, the same method was followed as in Example 1 to obtain a laminated board formed with an insulating layer. Note that, the total thickness of the resin layer was 14 μm. The obtained laminated board was measured for the amount of warping, whereupon the amount of warping was 3 mm. The results are shown in Table 1.

TABLE 1

|  | Example 1 | Comp. Ex. 1 | Comp. Ex. 2 |
| --- | --- | --- | --- |
| Composition of first resin layer | B-1 | B-1 | B-1 |
| Thickness of first resin layer (μm) | 3 | 3 | 3 |
| Composition of second resin layer | B-2 | B-2 | B-2 |
| Total thickness of resin layers (μm) | 13 | 14 | 14 |
| Treatment conditions of resin layers | Dipping in 5% TETA aqueous solution for 1 hour | Dipping in water for 1 hour | Dipping in 5% TETA aqueous solution for 1 hour |
| Curing conditions | Step cure 60 to 120° C. 1 hour 120° C. 0.5 hour 120 to 180° C. 1 hour 180° C. 0.5 hour | Step cure 60 to 120° C. 1 hour 120° C. 0.5 hour 120 to 180° C 1 hour 180° C. 0.5 hour | 180° C. 1 hour |
| Warping of board (mm) | 1.5 | 2.5 | 3 |

From Table 1, it will be understood that by using a curable composition which contains a heat curable resin and curing agent (I) to form a resin layer on a board, then bringing a curing agent (II) into contact with the resin layer surface and heating to a predetermined temperature, next heating the resin layer to cause it to cure and thereby form an insulating layer on a multilayer board, the amount of warping can be kept small (Example 1). As opposed to this, it will be understood that if not bringing the curing agent (II) into contact with the resin layer surface (Comparative Example 1) or bringing the curing agent (II) into contact with the resin layer surface, but not heating at a predetermined temperature (Comparative Example 2), the amount of warping of the multilayer board becomes larger.

The invention claimed is:

1. A method of production of a multilayer circuit board comprising using a curable composition which contains a heat curable resin and curing agent (I) to form an uncured or semicured resin layer on a board (step A), then bringing a curing agent (II) able to substantially to cure the heat curable resin at a temperature at which the curing agent (I) cannot substantially cure the heat curable resin into contact with a surface of the resin layer, then heating the resin layer at a temperature at which the curing agent (I) cannot substantially cure the heat curable resin and the curing agent (II) can substantially cure the heat curable resin (step B), next heating and curing the resin layer at a temperature at which the curing agent (I) can substantially cure the heat curable resin to form an electrical insulating layer (step C), wherein:

the curing agent (I) is at least one type of agent selected from the group consisting of a polyvalent epoxy compound, a dicarboxylic acid derivative, and a polyol compound, and the curing agent (II) is at least one type of agent selected from the group consisting of a polysulfide, polymercaptan, polyamide, chain aliphatic polyamine, cyclic aliphatic polyamine, and complexes of said amines.

2. The method of production of the multilayer circuit board as set forth in claim 1, wherein, at step A, the uncured or semicured resin layer is formed by bonding a film shaped or sheet shaped article of the curable composition to the surface of the board.

3. The method of production of the multilayer circuit board as set forth in claim 1, wherein, at step A, the uncured or semicured resin layer is formed at only one surface of the board.

4. The method of production of a multilayer circuit board as set forth in claim 1, wherein, at step B, contact of the curing agent (H) with the resin layer surface is performed by dipping a board on which a resin layer is formed in an aqueous solution of the curing agent (II).

5. The method of production of the multilayer circuit board as set forth in claim 1, wherein the heat curable resin is at least one type of resin selected from the group consisting of an epoxy resin, maleimide resin, (meth)acrylic resin, diallylphthalate resin, triazine resin, alicyclic olefin polymer, aromatic polyether polymer, benzocyclobutene polymer, cyanate ester polymer, liquid crystal polymer, and polyimide.

* * * * *